US012388033B2

(12) United States Patent
Schivalocchi

(10) Patent No.: US 12,388,033 B2
(45) Date of Patent: Aug. 12, 2025

(54) SINTERING PRESS FOR SINTERING ELECTRONIC COMPONENTS ON A SUBSTRATE

(71) Applicant: AMX—AUTOMATRIX S.R.L., Gavardo (IT)

(72) Inventor: Nicola Schivalocchi, Gavardo (IT)

(73) Assignee: AMX—AUTOMATRIX S.R.L., Gavardo (IT)

( * ) Notice: Subject to any disclaimer, the term of this patent is extended or adjusted under 35 U.S.C. 154(b) by 782 days.

(21) Appl. No.: 17/295,299

(22) PCT Filed: Dec. 17, 2019

(86) PCT No.: PCT/IB2019/060927
§ 371 (c)(1),
(2) Date: May 19, 2021

(87) PCT Pub. No.: WO2020/128836
PCT Pub. Date: Jun. 25, 2020

(65) Prior Publication Data
US 2022/0020710 A1   Jan. 20, 2022

(30) Foreign Application Priority Data
Dec. 20, 2018   (IT) .......................... 102018000020272

(51) Int. Cl.
*B30B 15/06*   (2006.01)
*H01L 23/00*   (2006.01)
*H01L 21/324*   (2006.01)

(52) U.S. Cl.
CPC ............ *H01L 24/04* (2013.01); *B30B 15/064* (2013.01); *B30B 15/067* (2013.01);
(Continued)

(58) Field of Classification Search
CPC ................ H01L 24/04; H01L 21/324; H01L 2224/75501; H01L 2224/75986; H01L 2224/8384; B30B 15/064; B30B 15/067
See application file for complete search history.

(56) References Cited

U.S. PATENT DOCUMENTS

2005/0168941 A1*   8/2005   Sokol ................ H05K 7/20445
                                                      361/688
2017/0136570 A1    5/2017   Seok et al.
2018/0033660 A1*   2/2018   Momma ................ H01L 22/20

FOREIGN PATENT DOCUMENTS

JP    2012204718 A    10/2012
WO    2018122795 A1    7/2018

OTHER PUBLICATIONS

International Search Report, issued in PCT/IB2019/060927, mailed Feb. 20, 2020, Rijswijk, Netherlands.

* cited by examiner

Primary Examiner — Alison L Hindenlang
Assistant Examiner — Erica Hartsell Funk
(74) Attorney, Agent, or Firm — ArentFox Schiff LLP; Michael Fainberg

(57) ABSTRACT

A sintering press for sintering electronic components on a substrate includes at least one reaction element extending along an element axis parallel to a pressing axis of the sintering press between a first element end and a second element end, the first element end forming a support plane for a respective substrate, at least one load cell operatively connected to the second element end, and an element plate slidably supporting the at least one reaction element and equipped with a heating circuit. The reaction element has a heating portion passing through the element plate and transmitting by conduction heat of the element plate to the substrate. The reaction element has a cooling portion ending (Continued)

with the second element end and shaped to dissipate the heat transmitted from the element plate to the heating portion.

7 Claims, 2 Drawing Sheets

(52) U.S. Cl.
CPC .. *H01L 21/324* (2013.01); *H01L 2224/75501* (2013.01); *H01L 2224/75986* (2013.01); *H01L 2224/8384* (2013.01)

SINTERING PRESS FOR SINTERING ELECTRONIC COMPONENTS ON A SUBSTRATE

CROSS-REFERENCE TO RELATED APPLICATIONS

This application is a National Phase Application of PCT International Application No. PCT/IB2019/060927, having an International Filing Date of Dec. 17, 2019 which claims priority to Italian Application No. 102018000020272 filed Dec. 20, 2018, each of which is hereby incorporated by reference in its entirety.

FIELD OF THE INVENTION

The present invention concerns a sintering press for sintering electronic components on a substrate.

BACKGROUND OF THE INVENTION

As is well known, in some electronics applications, integrated electronic components, e.g. diodes, IGBTs, thermistors, MOSFETs, are fixed to a substrate by the interposition of a sintering paste. In order for each component to be sintered correctly, it must be pressed onto the substrate while it is at a sintering temperature, for example greater than 200° C.

A sintering press usually comprises a base that forms a pressing plane on which one or more substrates are positioned. The press is equipped with a pressing unit provided, for each substrate, with one or more presser members controlled for example by a hydraulic circuit to exert a predetermined pressure on the electronic components to be sintered.

In some embodiments of the press, the base is further equipped with one or more load cells suitable to detect the sum of the forces exerted by the presser members on the electronic components for each substrate in order to monitor the correct operation of the press. The load cells are electronic components that have to operate at temperatures much lower than the sintering temperature.

One of the problems that afflict sintering presses of the type described above is therefore keeping the load cells at a much lower working temperature than the sintering temperature, even though the load cells are operatively connected to the pressing plane, as they must detect the correct application of the force exerted by the pressing members on the substrates.

SUMMARY OF THE INVENTION

The object of the present invention is to propose a press capable of solving such a problem.

Said object is achieved by a sintering press as described and claimed herein. Preferred embodiments of the present invention are also described.

BRIEF DESCRIPTION OF THE DRAWINGS

The features and advantages of the sintering press according to the invention will become evident from the description hereinafter of its preferred embodiments, provided by way of indicative and non-limiting examples, with reference to the accompanying figures, wherein.

DETAILED DESCRIPTION

Figure 1:
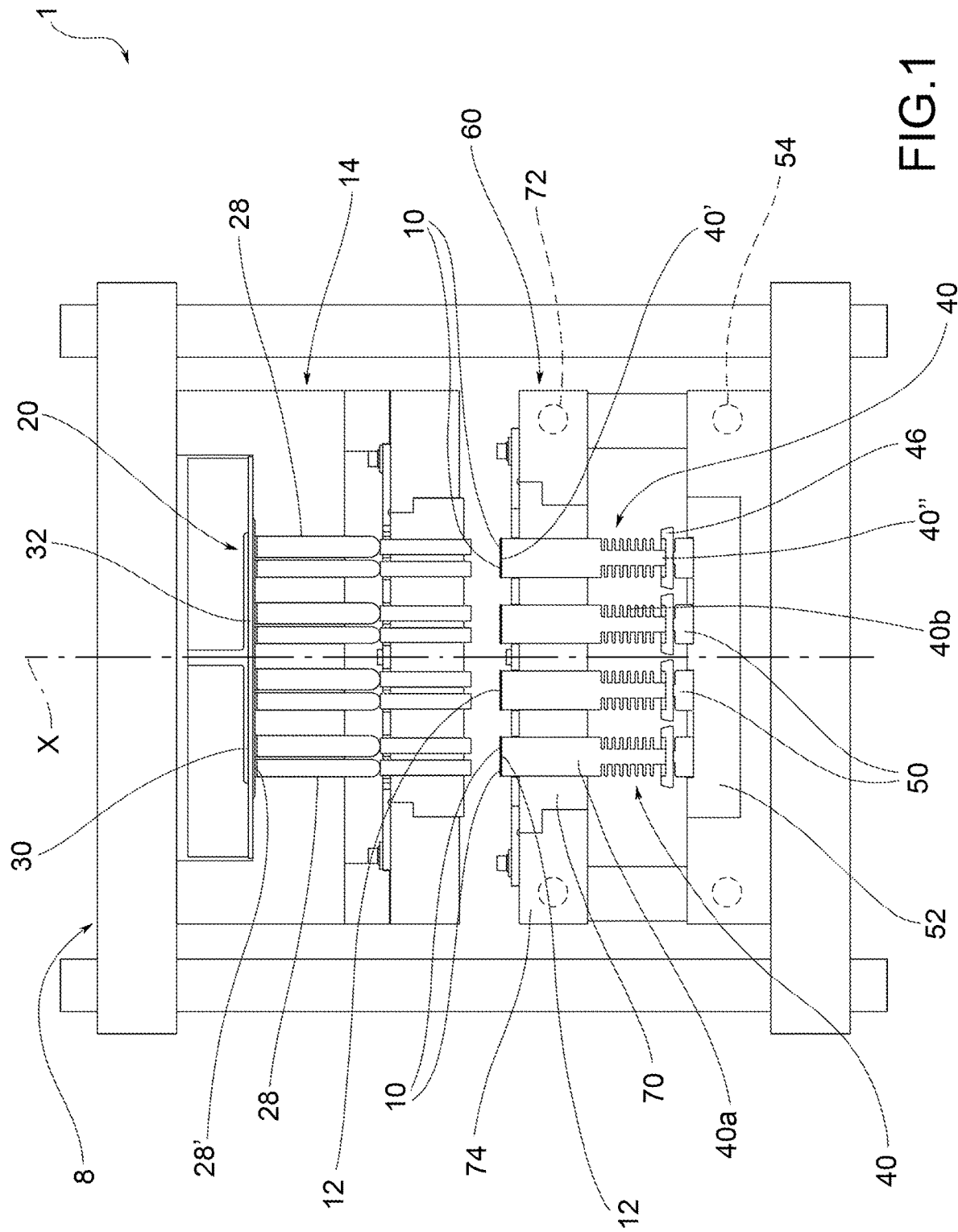
FIG. 1 is an axial section of the press according to the invention.
Figure 2:
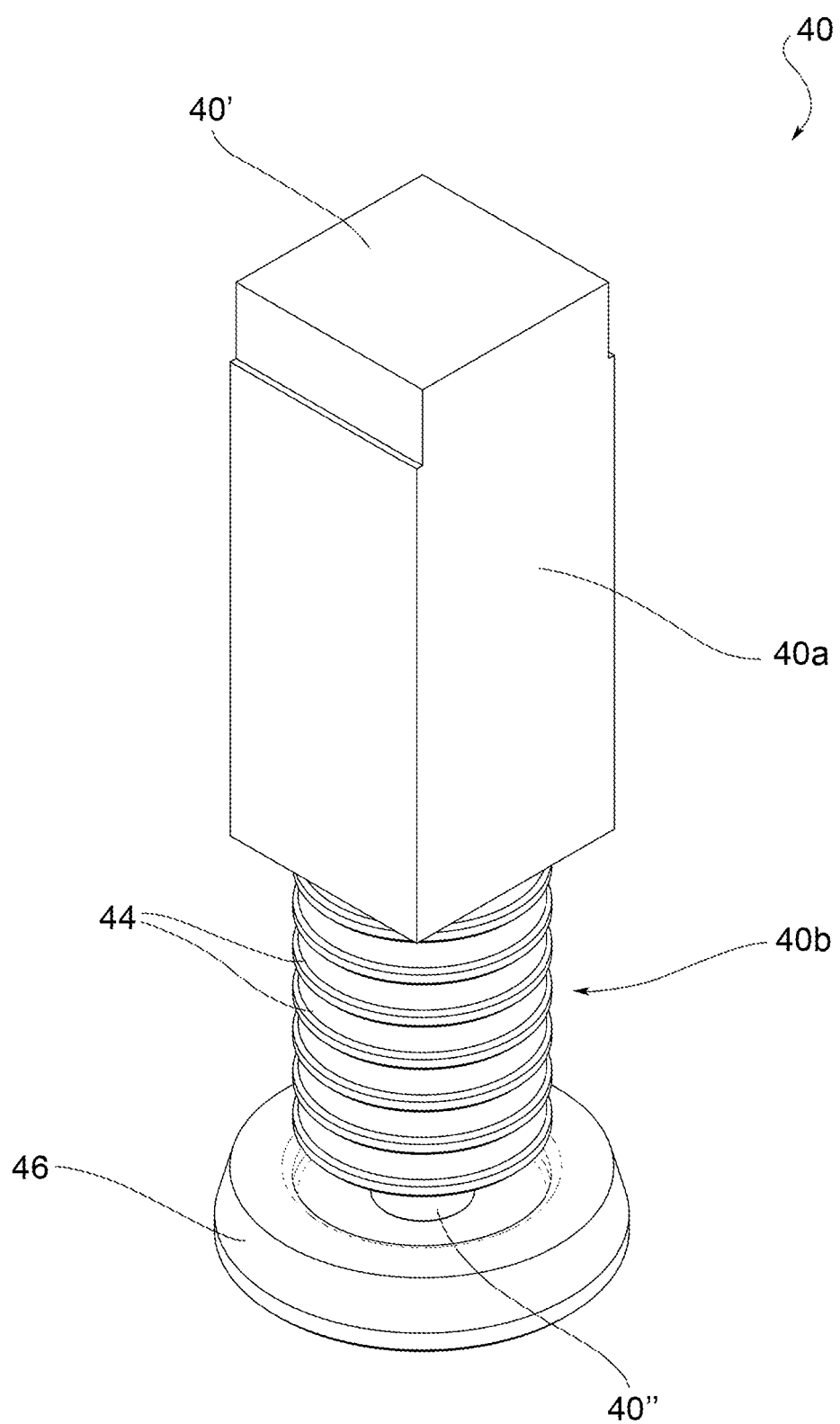
FIG. 2 is a perspective view of a reaction element.

In said drawings, a sintering press according to the invention has been indicated collectively at 1.

The press is suitable for sintering electronic components 10 on a substrate 12.

In one embodiment, the press 1 is designed to perform the simultaneous sintering of electronic components on a plurality of substrates 12.

The substrates 12 hold the electronic components 10 to be sintered (e.g. IGBTs, diodes, thermistors, MOSFETs) placed on a layer of sintering paste. The components 10 must be processed with a predefined surface pressure, for example 30 MPa, at a predefined temperature, for example 260° C., for 180 to 300 seconds.

The electronic components 10 must be pressed with a force directly proportional to their projection surface, taking into account that the components are of thicknesses varied by families.

The sintering press 1 comprises a framework 8, for example that extends vertically along a press axis X, which extends vertically and supports a pressing unit 14 at the top and a reaction base 60 at the bottom that supports at least one substrate 12, preferably a plurality of substrates 12.

One or both of the pressing unit 14 and the base 60 is movable with respect to the other along a press axis X to bring the electronic components to be sintered 10 substantially in contact with the pressing unit 14 to then carry out the pressing.

In one embodiment, the pressing unit 14 comprises, for each substrate 12, one or more presser members suitable to apply the necessary sintering pressure on the electronic components 10.

In one embodiment, the pressing unit 14 comprises a multi-rod cylinder 20 equipped with parallel and independent presser rods 28. Each presser rod 28 is coaxial and barycentric to a respective electronic component 10 to be sintered and has a thrust section proportional to the force to be exerted on the respective electronic component 10, the area of each electronic component to be sintered being known. The term "barycentric" means that each presser rod 28 has a rod axis that coincides with the barycenter of the respective electronic component 10.

In one embodiment, the presser rods 28 are driven by a pressurized control fluid. For example, the presser rods 28 communicate with a compression chamber 30 wherein the control fluid is introduced and wherein a suitable control element is housed to transfer the pressure exerted by the control fluid to the presser rods. For example, this control element is in the form of a membrane 32. When the compression chamber 30 is pressurized to the sintering pressure, the membrane 32 deforms by pressing against the rear ends 28' of the presser rods 28 for a transfer of the sintering pressure to each presser rod 28.

Naturally, other presser rod actuation systems may also be used.

In accordance with one aspect of the invention, the press comprises at least one reaction element 40, that extends along an element axis parallel to the press axis X between a first element end 40' and a second element end 40". The first element end 40' forms a support plane for a respective substrate 12.

A load cell 50 is operatively connected to the second element end 40". The load cell 50 is suitable to detect, by means of the reaction element 40, the force exerted by one or more presser rods 28 of the pressing unit 14 on the electronic components 10 to be sintered located on the substrate 12.

One should note that the load cell 50 may be used, according to the specific requirements, simply to detect that a pressure has been applied to the respective substrate, thus in ON/OFF operation mode, or to detect the value of the pressure applied, for example by a feedback pressure control.

In one embodiment, the load cell 50 is housed in a cell holder plate 52 operatively connected to a cooling circuit 54.

Each reaction element 40 is supported slidably in an element plate 70. The term "supported slidably" does not mean that the element must necessarily slide in the element plate 70, but that this element is inserted in a guided way in a respective guide seat made in the element plate without being bound thereto. In effect, as will be described below, the element plate 70 must ensure heat transmission therefrom to the reaction element 40, keeping the latter in the correct position parallel to the press axis X, but at the same time without affecting the force detected by the respective load cell 50.

One should note that, in a preferred embodiment, the second end 40" of the reaction element is always in contact with the load cell 50 whereby, during the pressing step, the reaction element 40 undergoes a substantially null or negligible axial displacement. In this case, the reaction element 40 provides a real contrast to the force exerted by the presser member, which is then completely absorbed by the electronic components to be sintered.

In one embodiment, the element plate 70 is heated by a heating circuit 72 suitable to bring the element plate 70 and, by conduction, the reaction elements 40 to the required sintering temperature. For example, the heating circuit 72 is embedded in a heater body 74 placed around the element plate 70.

Each reaction element 40 has a heating portion 40a that passes through the element plate 70 and that is suitable to transmit by conduction the heat of the element plate 70 to the respective substrate 12.

The reaction element 40 has moreover a cooling portion 40b ending with the second end 40" and shaped in such a way as to dissipate the heat transmitted from the element plate 70 to the heating portion 40a.

WU For example, the heating portion 40a and the cooling portion 40b are arranged consecutively.

In one embodiment, the heating portion 40a has an axial extension substantially equal to or slightly greater than the thickness of the element plate 70. For example, the heating portion 40a ends with the first end 40' of the reaction element 40, which protrudes axially from the element plate 70.

In one embodiment, the element plate 70 and the cell holder plate 52 are separated axially from each other by a separation fluid suitable to dissipate the heat of the reaction element, for example air.

For example, the cooling portion 40b has an extension substantially equal to the distance between the element plate 70 and the cell holder plate 52.

In one embodiment, the heating portion 40a is prism-shaped. For example, the heating portion 40a has an axial extension greater than the diameter of the support plane of the substrate.

In one embodiment, the cooling portion 40b comprises an axial succession of dissipating disks 44 that extend coaxially to the element axis.

In one embodiment, the second end 40" of the reaction element 40 is equipped with an infrared screen 46 facing the load cell 50.

In one embodiment, the heating circuit 72 is suitable to heat the element plate to a working temperature between 240° C. and 290° C.

For example, the element plate is made of a metallic material with high thermal conductivity.

For example, the heating circuit 72 comprises electrical resistors controlled by resistance thermometers.

In one embodiment, the cooling circuit 54 is suitable to keep the cell holder plate 52 at a temperature of about 25° C.

For example, the cooling system is based on the circulation of a coolant conditioned by a chiller.

The reaction element, combined with the heatable element plate and the coolable cell holder plate, therefore allows to:
  provide for the heating of the sintered substrate through the transmission of heat by conduction from the element plate to the heating portion of the reaction element;
  counteract the sintering pressure applied by the upper presser members;
  transmit the counteracting force to the load cell;
  reduce the heat transmission to the load cell.

The cooling circuit may therefore keep the load cell at an acceptable working temperature, for example 60° C. without excessive energy expenditure.

To the embodiments of the sintering press according to the invention, a person skilled in the art, to satisfy contingent needs, may make modifications, adaptations and replacements of elements with others that are functionally equivalent, without departing from the scope of the following claims. Each of the features described as belonging to a possible embodiment may be implemented independently from the other described embodiments.

The invention claimed is:

1. A sintering press for sintering electronic components on at least a substrate, the sintering press comprising:
   at least one reaction element extending along an element axis parallel to a pressing axis of the sintering press between a first element end and a second element end, wherein the first element end forms a support plane for a respective substrate;
   at least one load cell operatively connected to the second element end, so that said load cell detects, by the reaction element, a sum of forces exerted by one or more presser members of the sintering press on respective electronic components to be sintered placed on the substrate, the load cell being housed in a cell holder plate operatively connected to a cooling circuit;
   an element plate suitable for slidably supporting the at least one reaction element, the element plate comprising a heating circuit; and
   a reaction base, said reaction base comprising both the heating circuit and the cooling circuit, wherein the heating circuit and the cooling circuit are positioned on a same side with respect to the support plane for the substrate, wherein:
   the at least one reaction element comprises a heating portion passing through the element plate, and suitable for transmitting by conduction heat of the element plate to the substrate; and the at least one reaction element further comprises a cooling portion ending with the second element end and shaped to dissipate the heat transmitted from the element plate to the heating portion and, characterized in that said load cell being configured to operate at temperatures much lower than the sintering temperature.

2. The sintering press of claim 1, wherein the heating portion is prism-shaped.

3. The sintering press of claim 1, wherein the cooling portion comprises an axial succession of dissipating disks that extend coaxially to the element axis so as to dissipate the heat transmitted from the element plate to the heating portion.

4. The sintering press of claim 1, wherein the second element end of the reaction element is equipped with an infrared screen facing the load cell.

5. The sintering press of claim 1, wherein the heating circuit heats the element plate to a working temperature between 240° C. and 290° C.

6. The sintering press of claim 1, wherein the cooling circuit keeps the cell holder plate at a temperature of 25° C. to 60° C.

7. The sintering press of claim 1, comprising a plurality of reaction elements slidably supported by the element plate, a load cell being associated with each reaction element.

* * * * *